(12) United States Patent
He et al.

(10) Patent No.: US 10,103,746 B2
(45) Date of Patent: *Oct. 16, 2018

(54) METHODS AND DEVICES FOR CODING AND DECODING THE POSITION OF THE LAST SIGNIFICANT COEFFICIENT

(71) Applicant: BlackBerry Limited, Waterloo (CA)

(72) Inventors: Dake He, Waterloo (CA); Jing Wang, Waterloo (CA)

(73) Assignee: BlackBerry Limited, Waterloo, Ontario (CA)

( * ) Notice: Subject to any disclaimer, the term of this patent is extended or adjusted under 35 U.S.C. 154(b) by 37 days.

This patent is subject to a terminal disclaimer.

(21) Appl. No.: 15/208,717

(22) Filed: Jul. 13, 2016

(65) Prior Publication Data

US 2016/0322986 A1 Nov. 3, 2016

Related U.S. Application Data

(63) Continuation of application No. 13/874,549, filed on May 1, 2013, now Pat. No. 9,397,694, which is a continuation of application No. 13/087,462, filed on Apr. 15, 2011, now Pat. No. 8,446,301.

(51) Int. Cl.
*H03M 7/34* (2006.01)
*H03M 7/40* (2006.01)
*H03M 7/30* (2006.01)

(52) U.S. Cl.
CPC ........... *H03M 7/40* (2013.01); *H03M 7/3079* (2013.01); *H03M 7/3075* (2013.01)

(58) Field of Classification Search
CPC ..... H03M 7/40; H03M 7/3075; H03M 7/3079

USPC .... 341/50–107; 375/240.02, 240.13, 240.16, 375/240.12, 240.26; 382/240, 233, 239, 382/232, 247; 704/221, 205, 500

See application file for complete search history.

(56) References Cited

U.S. PATENT DOCUMENTS

| | | | |
|---|---|---|---|
| 6,215,906 B1 | 4/2001 | Okada |
| 6,492,916 B1 | 12/2002 | Schwartz et al. |
| 7,197,190 B1 | 3/2007 | Andrew |
| 7,245,241 B2 | 7/2007 | Cai et al. |
| 7,292,731 B2 | 11/2007 | Sekiguchi et al. |
| 7,629,904 B2 | 12/2009 | Cai et al. |

(Continued)

FOREIGN PATENT DOCUMENTS

| | | |
|---|---|---|
| EP | 2007147 | 12/2008 |
| EP | 2007147 A2 | 12/2008 |

OTHER PUBLICATIONS

International Search Report and Written Opinion relating to application No. PCT/CA2011/050200 dated Dec. 21, 2011.

(Continued)

*Primary Examiner* — Lam T Mai
(74) *Attorney, Agent, or Firm* — Rowand LLP

(57) ABSTRACT

Methods and devices are described for entropy coding data using an entropy coder to encode quantized transform domain coefficient data. Last significant coefficient information is signaled in the bitstream using two-dimensional coordinates for the last significant coefficient. The context for bins of one of the coordinates is based, in part, upon the value of the other of the coordinates. In one case, instead of signaling last significant coefficient information, the number of non-zero coefficients is binarized and entropy encoded.

24 Claims, 10 Drawing Sheets

(56) References Cited

U.S. PATENT DOCUMENTS

| | | | |
|---|---|---|---|
| 7,702,013 B2 | 4/2010 | Schwarz et al. | |
| 7,932,843 B2 | 4/2011 | Demircin et al. | |
| 8,090,574 B2 | 1/2012 | Mehrotra et al. | |
| 8,138,956 B2 | 3/2012 | Hsu et al. | |
| 8,144,784 B2 | 3/2012 | Tian et al. | |
| 8,446,301 B2 * | 5/2013 | He .......................... | H03M 7/40 |
| | | | 341/107 |
| 9,397,694 B2 * | 7/2016 | He .......................... | H03M 7/40 |

OTHER PUBLICATIONS

Heo et al., "Improved Context-Based Adaptive Binary Arithmetic Coding over H.264/AVC for Lossless Depth Map Coding", IEEE Signal Processing Letters, See whole document.
EPO, Extended European Search Report relating to application No. 17165803.2, dated Sep. 8, 2017.
Sole, J et al.:, "Parallel Context Processing for the significance map in high coding efficiency", 95. MPEG Meeting; Jan. 24, 2011-Jan. 28, 2011; Daegu; (Motion Picture Expert Group or ISO/IEC JTC1/SC29/WG11),, No. m19026, Jan. 21, 2011, XP30047594, *abstract*Section 2.1*.
Cheung Auyeung et al.:, "Context reduction of the last transform position in JCTVC-D262 for CE11.1", 5. JCT-VC Meeting; 96. MPEG Meeting; Mar. 16, 2011-Mar. 23, 2011; Geneva; (Joint Collaborative Team on Video Coding of ISO/IEC JTC1/SC29/WG11AND ITU-T SG.16); URL:http://WFTP3.ITU.INT/AV-ARCH/JCTVC-Site/,, No. JCTVC-E344, Mar. 11, 2011, XP03008850, ISSN: 0000-0005, *whole document*.
Wei Yu et al.:, "Probability Modeling for Encoding Quantized Transform Coefficients", 25. Picture Coding Symposium; Apr. 24, 2006-Apr. 26, 2006; Beijing,, Apr. 24, 2006, XP030080335, *whole document*.

* cited by examiner

METHODS AND DEVICES FOR CODING AND DECODING THE POSITION OF THE LAST SIGNIFICANT COEFFICIENT

CROSS-REFERENCE TO RELATED APPLICATIONS

The present application is a continuation of U.S. patent application Ser. No. 13/874,549, filed May 1, 2013, now U.S. Pat. No. 9,397,694, which is a continuation of U.S. patent application Ser. No. 13/087,462, filed Apr. 15, 2011, now U.S. Pat. No. 8,446,301, the contents of both of which are hereby incorporated by reference.

FIELD

The present application generally relates to data compression and, in particular, to an encoder, a decoder and methods of coding and decoding the last significant transform coefficient.

BACKGROUND

Data compression, whether lossy or lossless, often uses entropy coding to encode a decorrelated signal as a sequence of bits, i.e. a bitstream. Efficient data compression has a wide range of applications, such as image, audio, and video encoding. The current state-of-the-art for video encoding is the ITU-T H.264/MPEG AVC video coding standard. It defines a number of different profiles for different applications, including the Main profile, Baseline profile and others. A next-generation video encoding standard is currently under development through a joint initiative of MPEG-ITU: High Efficiency Video Coding (HEVC).

There are a number of standards for encoding/decoding images and videos, including H.264, that employ lossy compression processes to produce binary data. For example, H.264 includes a prediction operation to obtain residual data, followed by a DCT transform and quantization of the DCT coefficients. The resulting data, including quantized coefficients, motion vectors, coding mode, and other related data, is then entropy coded to generate a bitstream of data for transmission or storage on a computer-readable medium. It is expected that HEVC will also have these features.

A number of coding schemes have been developed to encode binary data. For example, JPEG images may be encoded using Huffman codes. The H.264 standard allows for two possible entropy coding processes: Context Adaptive Variable Length Coding (CAVLC) or Context Adaptive Binary Arithmetic Coding (CABAC). CABAC results in greater compression than CAVLC, but CABAC is more computationally demanding. In any of these cases, the coding scheme operates upon the binary data to produce a serial bitstream of encoded data. At the decoder, the decoding scheme receives the bitstream and entropy decodes the serial bitstream to reconstruct the binary data.

It would be advantageous to provide for an improved encoder, decoder and method of entropy coding and decoding.

BRIEF DESCRIPTION OF THE DRAWINGS

Reference will now be made, by way of example, to the accompanying drawings which show example embodiments of the present application, and in which.

Similar reference numerals may have been used in different figures to denote similar components.

DESCRIPTION OF EXAMPLE EMBODIMENTS

Figure 1:
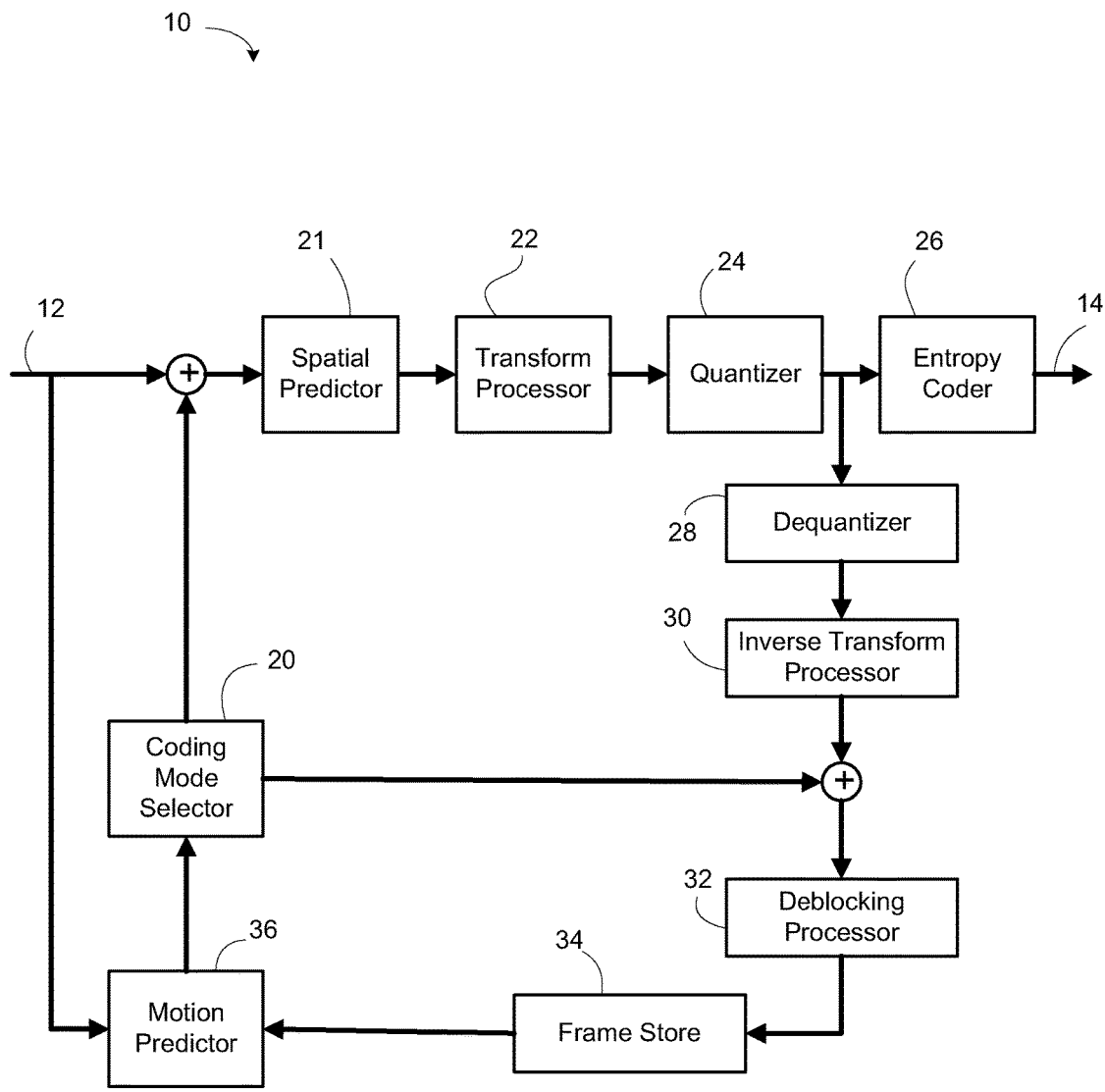
FIG. 1 shows, in block diagram form, an encoder for encoding video.

The present application describes devices, methods and processes for encoding and decoding binary data. In particular, the present application describes methods and devices for coding and decoding the last significant coefficient position in a block-based coding scheme.

In one aspect, the present application describes a method for encoding quantized transform domain coefficient data including last significant coefficient information. The method includes binarizing each of two positions of two-dimensional coordinates of the last significant coefficient; determining a context for each bin of one of the positions; determining a context for each bin of the other of the positions, wherein the context of each bin of the other of the positions is based, in part, upon said one of the positions; and entropy encoding the binarized positions based upon the context determined for each of the bins of the binarized positions to produce encoded data.

In another aspect, the present application describes a method for decoding a bitstream of encoded data to reconstruct quantized transform domain coefficient data. The method includes entropy decoding a portion of the encoded data to produce two binarized positions defining two-dimensional coordinates of a last significant coefficient, wherein entropy decoding the portion of the data includes determining a context for each bin of one of the positions, and determining a context for each bin of the other of the positions, wherein the context of each bin of the other of the positions is based, in part, upon said one of the positions; entropy decoding a significant coefficient sequence based upon the two-dimensional coordinates of the last significant coefficient; entropy decoding level information based upon the significant coefficient sequence; and reconstructing the quantized transform domain coefficient data using the level information and the significant coefficient sequence.

In a further aspect, the present application describes a method for encoding quantized transform domain coefficient data in an encoder having a processor. The method includes determining, with the processor, an x-coordinate and a y-coordinate for a last-significant-coefficient position within a block of the quantized transform domain coefficient data; and entropy encoding, with the processor, the x-coordinate and the y-coordinate by determining a context for encoding of one of the coordinates based upon the value of the other of the coordinates.

In another aspect, the present application describes a method for decoding a bitstream of encoded data to reconstruct quantized transform domain coefficient data in a decoder having a processor. The method includes entropy decoding, with a processor, a portion of the encoded data to reconstruct an x-coordinate and a y-coordinate for a last-significant-coefficient position within a block of the quantized transform domain coefficient data, including determining a context for entropy decoding a first one of the coordinates, and determining a context for entropy decoding the second of the coordinates based upon the reconstructed value of the first one of the coordinates.

In yet a further aspect, the present application describes non-transitory computer-readable media storing computer-executable program instructions which, when executed, configured a processor to perform the described methods of encoding and/or decoding.

Other aspects and features of the present application will be understood by those of ordinary skill in the art from a review of the following description of examples in conjunction with the accompanying figures.

The following description relates to data compression in general and, in particular, to the efficient encoding and decoding of finite alphabet sources, such as a binary source. In many of the examples given below, particular applications of such an encoding and decoding scheme are given. For example, many of the illustrations below make reference to video coding. It will be appreciated that the present application is not necessarily limited to video coding or image coding. It may be applicable to the any type of data subject to a context-based encoding scheme of data that is block-based and that involves signaling the position of the last significant bit or symbol in the block.

The example embodiments described herein relate to data compression of a finite alphabet source. Accordingly, the description often makes reference to "symbols", which are the elements of the alphabet. In some cases, the description herein refers to binary sources, and refers to the symbols as bits. At times, the terms "symbol" and "bit" may be used interchangeably for a given example. It will be appreciated that a binary source is but one example of a finite alphabet source. The present application is not limited to binary sources.

In the description that follows, example embodiments are described with reference to the H.264 standard. Those ordinarily skilled in the art will understand that the present application is not limited to H.264 but may be applicable to other video coding/decoding standards, including possible future standards, such as HEVC. It will also be appreciated that the present application is not necessarily limited to video coding/decoding and may be applicable to coding/decoding of any finite alphabet sources.

Figure 2:
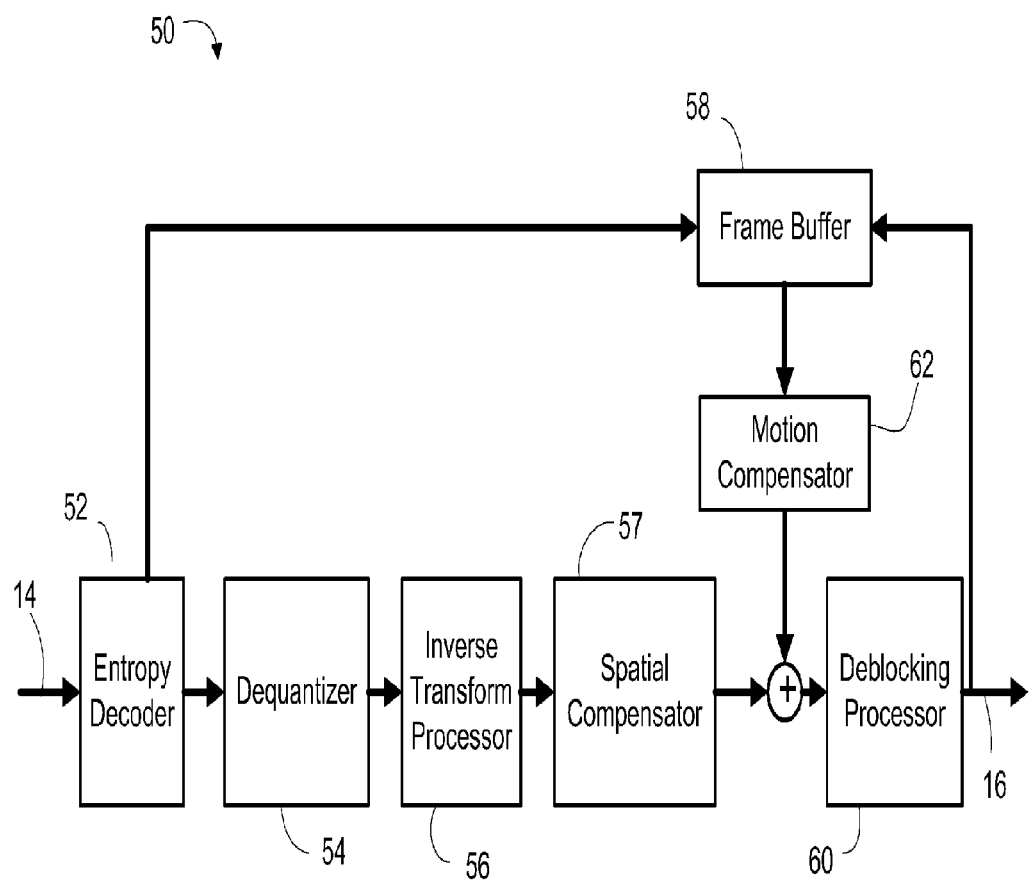
FIG. 2 shows, in block diagram form, a decoder for decoding video.

Reference is now made to FIG. 1, which shows, in block diagram form, an encoder 10 for encoding video. Reference is also made to FIG. 2, which shows a block diagram of a decoder 50 for decoding video. It will be appreciated that the encoder 10 and decoder 50 described herein may each be implemented on an application-specific or general purpose computing device, containing one or more processing elements and memory. The operations performed by the encoder 10 or decoder 50, as the case may be, may be implemented by way of application-specific integrated circuit, for example, or by way of stored program instructions executable by a general purpose processor. The device may include additional software, including, for example, an operating system for controlling basic device functions. The range of devices and platforms within which the encoder 10 or decoder 50 may be implemented will be appreciated by those ordinarily skilled in the art having regard to the following description.

The encoder 10 receives a video source 12 and produces an encoded bitstream 14. The decoder 50 receives the encoded bitstream 14 and outputs a decoded video frame 16. The encoder 10 and decoder 50 may be configured to operate in conformance with a number of video compression standards. For example, the encoder 10 and decoder 50 may be H.264/AVC compliant. In other embodiments, the encoder 10 and decoder 50 may conform to other video compression standards, including evolutions of the H.264/AVC standard, such as HEVC.

The encoder 10 includes a spatial predictor 21, a coding mode selector 20, transform processor 22, quantizer 24, and entropy coder 26. As will be appreciated by those ordinarily skilled in the art, the coding mode selector 20 determines the appropriate coding mode for the video source, for example whether the subject frame/slice is of I, P, or B type, and whether particular macroblocks (or coding units) within the frame/slice are inter or intra coded. The transform processor 22 performs a transform upon the spatial domain data. In particular, the transform processor 22 applies a block-based transform to convert spatial domain data to spectral components. For example, in many embodiments a discrete cosine transform (DCT) is used. Other transforms, such as a discrete sine transform or others may be used in some instances. Applying the block-based transform to a block of pixel data results in a set of transform domain coefficients. The set of transform domain coefficients is quantized by the quantizer 24. The quantized coefficients and associated information, such as motion vectors, quantization parameters, etc., are then encoded by the entropy coder 26.

Intra-coded frames/slices (i.e. type I) are encoded without reference to other frames/slices. In other words, they do not employ temporal prediction. However intra-coded frames do rely upon spatial prediction within the frame/slice, as illustrated in FIG. 1 by the spatial predictor 21. That is, when encoding a particular block the data in the block may be compared to the data of nearby pixels within blocks already encoded for that frame/slice. Using a prediction algorithm, the source data of the block may be converted to residual data. The transform processor 22 then encodes the residual data. H.264, for example, prescribes nine spatial prediction modes for 4×4 transform blocks. In some embodiments, each of the nine modes may be used to independently process a block, and then rate-distortion optimization is used to select the best mode.

The H.264 standard also prescribes the use of motion prediction/compensation to take advantage of temporal prediction. Accordingly, the encoder 10 has a feedback loop that includes a de-quantizer 28, inverse transform processor 30, and deblocking processor 32. These elements mirror the decoding process implemented by the decoder 50 to reproduce the frame/slice. A frame store 34 is used to store the reproduced frames. In this manner, the motion prediction is based on what will be the reconstructed frames at the decoder 50 and not on the original frames, which may differ from the reconstructed frames due to the lossy compression involved in encoding/decoding. A motion predictor 36 uses the frames/slices stored in the frame store 34 as source frames/slices for comparison to a current frame for the purpose of identifying similar blocks. Accordingly, for macroblocks to which motion prediction is applied, the "source data" which the transform processor 22 encodes is the residual data that comes out of the motion prediction process. The residual data is pixel data that represents the differences (if any) between the reference block and the current block. Information regarding the reference frame and/or motion vector may not be processed by the transform processor 22 and/or quantizer 24, but instead may be supplied to the entropy coder 26 for encoding as part of the bitstream along with the quantized coefficients.

Those ordinarily skilled in the art will appreciate the details and possible variations for implementing H.264 encoders.

The decoder 50 includes an entropy decoder 52, dequantizer 54, inverse transform processor 56, spatial compensator 57, and deblocking processor 60. A frame buffer 58 supplies reconstructed frames for use by a motion compensator 62 in applying motion compensation. The spatial compensator 57 represents the operation of recovering the video data for a particular intra-coded block from a previously decoded block.

The bitstream 14 is received and decoded by the entropy decoder 52 to recover the quantized coefficients. Side information may also be recovered during the entropy decoding process, some of which may be supplied to the motion compensation loop for use in motion compensation, if applicable. For example, the entropy decoder 52 may recover motion vectors and/or reference frame information for inter-coded macroblocks.

The quantized coefficients are then dequantized by the dequantizer 54 to produce the transform domain coefficients, which are then subjected to an inverse transform by the inverse transform processor 56 to recreate the "video data". It will be appreciated that, in some cases, such as with an intra-coded macroblock, the recreated "video data" is the residual data for use in spatial compensation relative to a previously decoded block within the frame. The spatial compensator 57 generates the video data from the residual data and pixel data from a previously decoded block. In other cases, such as inter-coded macroblocks, the recreated "video data" from the inverse transform processor 56 is the residual data for use in motion compensation relative to a reference block from a different frame. Both spatial and motion compensation may be referred to herein as "prediction operations".

The motion compensator 62 locates a reference block within the frame buffer 58 specified for a particular inter-coded macroblock. It does so based on the reference frame information and motion vector specified for the inter-coded macroblock. It then supplies the reference block pixel data for combination with the residual data to arrive at the recreated video data for that macroblock.

A deblocking process may then be applied to a reconstructed frame/slice, as indicated by the deblocking processor 60. After deblocking, the frame/slice is output as the decoded video frame 16, for example for display on a display device. It will be understood that the video playback machine, such as a computer, set-top box, DVD or Blu-Ray player, and/or mobile handheld device, may buffer decoded frames in a memory prior to display on an output device.

Entropy coding is a fundamental part of all lossless and lossy compression schemes, including the video compression described above. The purpose of entropy coding is to represent a presumably decorrelated signal, often modeled by an independent, but not identically distributed process, as a sequence of bits. The technique used to achieve this must not depend on how the decorrelated signal was generated, but may rely upon relevant probability estimations for each upcoming symbol.

There are two common approaches for entropy coding used in practice: the first one is variable-length coding, which identifies input symbols or input sequences by codewords, and the second one is range (or arithmetic) coding, which encapsulates a sequence of subintervals of the [0, 1) interval, to arrive at a single interval, from which the original sequence can be reconstructed using the probability distributions that defined those intervals. Typically, range coding methods tend to offer better compression, while VLC methods have the potential to be faster. In either case, the symbols of the input sequence are from a finite alphabet.

A special case of entropy coding is when the input alphabet is restricted to binary symbols. Here VLC schemes must group input symbols together to have any potential for compression, but since the probability distribution can change after each bit, efficient code construction is difficult. Accordingly, range encoding is considered to have greater compression due to its greater flexibility, but practical applications are hindered by the higher computational requirements of arithmetic codes.

A common challenge for both of these encoding approaches is that they are serial in nature. In some important practical applications, such as high-quality video decoding, the entropy decoder has to reach very high output speed, which can pose a problem for devices with limited processing power or speed.

One of the techniques used together with some entropy coding schemes, such as CAVLC and CABAC, both of which are used in H.264/AVC, is context modeling. With context modeling, each bit of the input sequence has a context, where the context may be given by a certain subset of the other bits, such as the bits that preceded it, or side information, or both. In a first-order context model, the context may depend entirely upon the previous bit (symbol). In many cases, the context models may be adaptive, such that the probabilities associated with symbols for a given context may change as further bits of the sequence are processed. In yet other cases, the context of a given bit may depend upon its position in the sequence, e.g. the position or ordinal of a coefficient in a matrix or block of coefficients.

Figure 3:
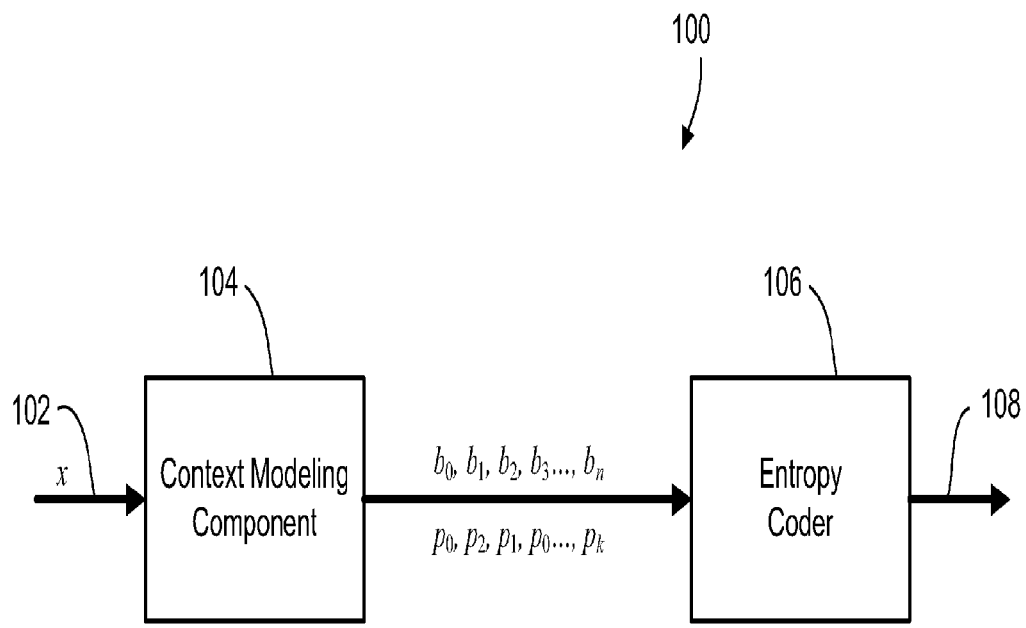
FIG. 3 shows a block diagram of an encoding process.

Reference is made to FIG. 3, which shows a block diagram of an example encoding process 100. The encoding process 100 includes a context modeling component 104 and an entropy coder 106. The context modeling component 104 receives the input sequence x 102, which in this example is a bit sequence ($b_0, b_1, \ldots, b_n$). In this example illustration, the context modeling component 104 determines a context for each bit $b_i$, perhaps based on one or more previous bits in the sequence or based on side information, and determines, based on the context, a probability $p_i$ associated with that bit $b_i$, where the probability is the probability that the bit will be the Least Probable Symbol (LPS). The LPS may be "0" or "1" in a binary embodiment, depending on the convention or application. The determination of the probability may itself depend upon the previous bits/symbols for that same context.

The context modeling component outputs the input sequence, i.e. the bits ($b_0, b_1, \ldots, b_n$) along with their respective probabilities ($p_0, p_1, \ldots, p_n$). The probabilities are an estimated probability determined by the context model. This data is then input to the entropy coder 106, which encodes the input sequence using the probability information. For example, the entropy coder 106 may be a binary arithmetic coder. The entropy coder 106 outputs a bitstream 108 of encoded data.

It will be appreciated each bit of the input sequence is processed serially to update the context model, and the serial bits and probability information are supplied to the entropy coder 106, which then serially entropy codes the bits to create the bitstream 108. Those ordinarily skilled in the art will appreciate that, in some embodiments, explicit probability information may not be passed from the context modeling component 104 to the entropy coder 106; rather, in some instances, for each bit the context modeling component 104 may send the entropy coder 106 an index or other indicator that reflects the probability estimation made by the context modeling component 104 based on the context model and the current context of the input sequence 102. The index or other indicator is indicative of the probability estimate associated with its corresponding bit.

In some embodiments, the entropy coder 106 may have a parallel processing architecture for encoding the input sequence 102. In such an embodiment, the entropy coder 106 may include a plurality of entropy coders each processing a portion of the input sequence 102. In some cases, the input sequence may be demultiplexed and allocated amongst the parallel entropy coders on the basis of the estimated probabilities associated with the respective bits. In other words, a bit from the input sequence 102 is allocated to one of the parallel entropy coders on the basis of its estimated probability.

At the decoder, the encoded bitstream is decoded using a reverse process. In particular, the decoder performs the same context modeling and probability estimation process to determine the context of the next reconstructed symbol of the reconstructed sequence. On the basis of the context determined for the next reconstructed symbol, an estimated probability is determined. The encoded bitstream, which may be made up of codewords output by the entropy coder(s), is decoded to obtain decoded symbols. The determination of context/probability is interleaved with the decoding of codewords to obtain decoded symbols corresponding to those estimate probabilities.

In a parallel encoding embodiment, the decoder may be configured to demultiplex the encoded bitstream into a plurality of decoded subsequences, each associated with an estimated probability. The context modeling and probability estimation then results in selection of a reconstructed symbol from the associated decode subsequence. It will be appreciated that in such an implementation the decoding of the encoded bitstream may be considered de-interleaved from the context modeling and probability estimation.

It will be appreciated from the detailed description below that the present application is applicable to either serial or parallel entropy coding and decoding.

The present application proposes an encoding and decoding process in which the last significant coefficient position is encoded and in which the context of one of the axes of the position is dependent upon the other axis.

The examples below may refer specifically to video encoding and, in particular, to the encoding of the sequences sig[i,j] and last[i,j] defined in CABAC as specified in the ITU-T H.264/AVC standard. It will be appreciated that the present application is not limited to the encoding and decoding of these two specific sequences within CABAC; nor is it limited to video encoding and decoding or to the H.264/AVC standard. The present application describes encoding and decoding methods and processes that may be applied to other data sequences, including video, image, and, in some instances, audio. The methods and processes herein are applicable to encoding and decoding processes that involve a context model which encodes last significant coefficient position and in which the position is, or can be modeled as, two-dimensional. The examples below may refer to a binary source as an example, although the present application is more generally applicable to any finite alphabet source.

As described above, example video and image encoding and decoding processes employ a block-based transform to convert residual data from the pixel domain to the transform domain. Example block-based transforms are a 4×4 DCT or 8×8 DCT. Other sizes or types of transforms (DST or DFT, etc.) may be used in some applications. The matrix or set of transform data is then quantized by a quantizer to produce a matrix or set of quantized transform domain coefficients. The present application may refer to the matrix of quantized transform domain coefficients as a matrix, a set, or a block, meaning an ordered set of data in which the position of any one of the coefficients may be specified by two-dimensional coordinates: [x,y].

The entropy encoding of the block of quantized transform domain coefficients is based upon a context model. For example, in H.264/AVC, the block is entropy encoded by first encoding a significance map. The significance map includes two sequences: last [i,j] and sig[i,j]. The sequence sig[i,j] is a binary sequence indicating whether there is a non-zero coefficient in each position in the DCT block. The other sequence last[i,j] is a binary sequence mapped to the non-zero coefficients of the DCT block and indicating whether that non-zero coefficient is the last non-zero coefficient of the DCT block (in the zig-zag scanning order used in H.264 and other transform domain image or video encoding schemes). It should be noted that the indices [i,j] are not two-dimensional coordinate positions in the block; the index i is an index to the block and the index j is an index to the one-dimensional coefficient position in the zig-zag scanning order described below.

Figure 6:
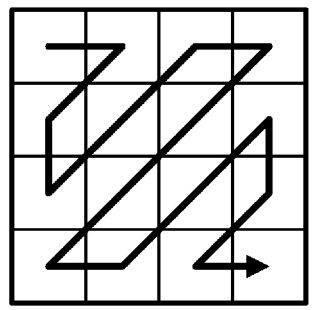
FIG. 6 illustrates a zig-zag coding order for a 4×4 block of coefficients.

The H.264 standard specifies a zig-zag scanning order, for encoding the coefficients of a DCT block. Referring to a 4×4 DCT block for example, the H.264 standard encodes the 16 coefficients in the zig-zag order illustrated in FIG. 6. As shown in FIG. 6, the scanning order begins in the upper left corner of the block and follows a zig-zag pattern to the lower right corner. Once arranged in this coding order, the resulting sequence of coefficients for the $i^{th}$ block is X(i, 0), . . . , X(i, 15).

The H.264/AVC standard uses a scheme in which the blocks are encoded in sequence. In other words, each sequence X(i, 0), . . . , X(i, 15) is encoded in turn. The context model used in H.264/AVC includes determining the two binary sequences, sig[i,j] and last[i, j], for each vector X[i,j]. The actual values of the coefficients, referred to as levels, are then also encoded.

To illustrate by example, consider the following example coefficient sequences X:

3, 5, 2, 0, 1, 1, 0, 1, 0, 0, 0, 0, 0, 0, 0, 0 i=0
6, 4, 0, 3, 3, 0, 1, 0, 0, 0, 0, 0, 0, 0, 0, 0 i=1
4, 2, 0, 0, 1, 0, 0, 0, 0, 0, 0, 0, 0, 0, 0, 0 i=2

The sequences sig[i,j] and last[i,j] for these coefficient sequences are as follows:

sig [0,j]=1, 1, 1, 0, 1, 1, 0, 1
last [0,j]=0, 0, 0, 0, 0, 1
sig [1,j]=1, 1, 0, 1, 1, 0, 1
last [1,j]=0, 0, 0, 0, 1
sig [2,j]=1, 1, 0, 0, 1
last [2,j]=0, 0, 1

It will be appreciated that the last[i,j] sequence only includes values when the sig[i,j] is non-zero, and both sequences terminate after the last non-zero coefficient. Accordingly, last[i,j] will not necessarily include a bit for every bit j in sig[i,j]. It will be appreciated that the lengths of these sequences may vary depending on the coefficient values. Finally, it will be appreciated that if one knows whether the sig[i,j] sequence contains a non-zero bit, then one will know whether there is a corresponding bit in the last[i,j] sequence or not, meaning the encoding and decoding of these sequences is interleaved by bit position.

In the H.264/AVC example the probability (sometimes termed "state") for a bit is determined based on its context. Specifically, the bit history for that same context determines the probability that is selected or assigned to that bit. For example, for a bit in the $j^{th}$ position in a given sequence i, its probability is selected from amongst the 64 possible probabilities based on the history of bits in the $j^{th}$ position in previous sequences (i−1, etc.).

As described above, the bits are encoded based upon their probabilities. In some example embodiments, parallel encoding may be used and, in some instances, the parallel encoding may include an entropy coder specific to each probability. In other example embodiments, serial entropy encoding may be used. In either case, the entropy coder encodes symbols based on their associated probabilities.

At the decoder, the same context modeling and probability estimation occurs in reconstructing the sequence. The probability estimation is used to decode the encoded bitstream to obtain reconstructed symbols. Symbols are selected from the decoded portions of the encoded bitstream and interleaved to form the reconstructed sequence of symbols on the basis of their associated probabilities and the context model.

The syntax for a residual block in H.264/AVC using CABAC, is set out in the table below:

The above table provides pseudocode for entropy decoding a bitstream containing sig[i,j], last[i,j] and level information. The descriptor "ae(v)" indicates the entropy decoding of bits from the bitstream to obtain the values indicated in that row in the table.

It will be noted that the bits of sig[i,j] and last[i,j] are interleaved in this syntax. For example, the "if(coded_block_flag)" loop contains the decoding of a bit from the sig[i,j] sequence (referred to as significant_coeff_flag[i]) followed by decoding of a bit from the last[i,j] sequence (referred to as last_significant_coeff_flag[i]) if the significant_coeff_flag[i] bit was non-zero.

It will also be appreciated that this syntax relies upon a sequence to signal the one-dimensional position of the last significant coefficient in the zig-zag scan order for the block.

In accordance with one aspect of the present application, the syntax is modified to signal the two-dimensional coordinates of the last significant coefficient within the block. For example, in a 4×4 block, the position of the last significant coefficient has x- and y-coordinates, where x and y range between 0 and 3. This coordinate pair may be communicated in the syntax in place of the last[i,j] sequence.

The question that arises is how to efficiently and effective code the two-dimensional coordinates of the last significant coefficient. A further question is whether modifications to the context model should be made for the encoding of this parameter.

In accordance with an aspect of the present application, the two-dimensional coordinates are encoded in turn, with the value of the first coordinate being partly used to determine the context for encoding the second coordinate. This concept is based on there being a certain degree of correlation between the values of two coordinates in the pair, as has been observed empirically. The value of an x-coordinate tends to have a material impact on the probability of the

TABLE 1

| residual_block_cabac( coeffLevel, startIdx, endIdx, maxNumCoeff ) { | Descriptor |
|---|---|
|   if( maxNumCoeff != 64 \|\| ChromaArrayType = = 3 ) | ae(v) |
|     coded_block_flag | ae(v) |
|   for( i = 0; i < maxNumCoeff; i++ ) | |
|     coeffLevel[ i ] = 0 | |
|   if( coded_block_flag ) { | |
|     numCoeff = endIdx + 1 | |
|     i = startIdx | |
|     while( i < numCoeff − 1 ) { | |
|       significant_coeff_flag[ i ] | ae(v) |
|       if( significant_coeff_flag[ i ] ) { | |
|         last_significant_coeff_flag[ i ] | ae(v) |
|         if( last_significant_coeff_flag[ i ] ) | |
|           numCoeff = i + 1 | |
|       } | |
|       i++ | |
|     } | |
|     coeff_abs_level_minus1[ numCoeff − 1 ] | ae(v) |
|     coeff_sign_flag[ numCoeff − 1 ] | ae(v) |
|     coeffLevel[ numCoeff − 1 ] = | |
|       ( coeff_abs_level_minus1[ numCoeff − 1 ] + 1 ) * | |
|       ( 1 − 2 * coeff_sign_flag[ numCoeff − 1 ] ) | |
|     for( i = numCoeff − 2; i >= startIdx; i− − ) | |
|       if( significant_coeff_flag[ i ] ) { | |
|         coeff_abs_level_minus1[ i ] | ae(v) |
|         coeff_sign_flag[ i ] | ae(v) |
|         coeffLevel[ i ] = ( coeff_abs_level_minus1[ i ] + 1 ) * | |
|             ( 1 − 2 * coeff_sign_flag[ i ] ) | |
|       } | |
|   } | |
| } | | values for the corresponding y-coordinate. This relationship can be exploited to improve the efficiency of the encoding.

In one embodiment in accordance with an aspect of the present application, fixed length codes are used to binarize the x-coordinate and y-coordinate values. Other binarization schemes may be used in other embodiments.

In accordance with another aspect of the present application, the syntax for encoding residual blocks is further modified to include a flag for signaling that the last significant coefficient is the DC coefficient at [0,0]. This is not an uncommon occurrence in practical implementations and when this situation is signaled in the bitstream, the bitstream may forego including the x- and y-coordinate values for the last significant coefficient in those situations, thereby improving compression efficiency.

In the description herein, the term "position" may at times be used to refer to the x-coordinate or y-coordinate, as the case may be.

Although example embodiments described below specify that the context for encoding the bits of the y-position are dependent, in part, upon the value of the x-position, the order is arbitrary. In another embodiment, the context for encoding the x-position may be dependent, in part, upon the value of the y-position.

One example embodiment of the syntax for encoding a residual block in accordance with an aspect of the present application is set out in the table below:

From the above pseudocode, it will be noted that the decoder initializes values for the x-position (last_pos_x=0) and the y-position (last_pos_y=0) and then reads the flag for signaling that the last significant coefficient is the DC coefficient (last_0_flag). The loop immediately afterwards is only performed if the last_0_flag does not indicate that the last significant coefficient is at [0,0]. In that case, the decoder then reads the values for last_pos_x and last_pos_y from the bitstream.

It will also be noted that in this embodiment if the last_pos_x value is 0, then the y-position is encoded as its value decremented by 1, since we know the two-dimensional position in that situation cannot be [0,0] due to the flag setting, so the y-position must be 1 or higher. Because of this encoding syntax, if last_pos_x is set to 0 then the value for last_pos_y is incremented by 1 to restore it to its actual value. Decrementing last_pos_y by 1 for the purpose of encoding in this specific situation is for efficiency purposes in the entropy encoding.

After the two-dimensional coordinates have been read, then the decoder goes on to read the significant_coeff_flag[i] sequence from the bitstream. The index [i] sets the current pos_x and pos_y values using a zigzag table for mapping the index to coordinate positions. When the pos_x and pos_y values match the last_pos_x and last_pos_y values, respectively, then the last_significant_coeff_flag is set so as to stop the reading of the sig[i,j] sequence, which is read bit-by-bit as significant_coeff_flag[i].

TABLE 2

| residual_block_cabac( coeffLevel, startIdx, endIdx, maxNumCoeff ) { | Descriptor |
|---|---|
|   if( maxNumCoeff != 64 \|\| ChromaArrayType == 3 ) | ae(v) |
|     coded_block_flag | ae(v) |
|   for( i = 0; i < maxNumCoeff; i++ ) | |
|     coeffLevel[ i ] = 0 | |
|   if( coded_block_flag ) { | |
|     numCoeff = endIdx + 1 | |
|     i = startIdx | |
|     last_pos_x = 0 | |
|     last_pos_y = 0 | |
|     last_0_flag | ae(v) |
|     if( !last_0_flag ) { | |
|       last_pos_x | ae(v) |
|       last_pos_y | ae(v) |
|       if( last_pos_x == 0 ) | |
|         last_pos_y++ | |
|     } | |
|     last_significant_coeff_flag = 0 | |
|     while( i < numCoeff − 1 ) { | |
|       (pos_x, pos_y) = zigzagTable[i] | |
|       if( pos_x == last_pos_x && pos_y == last_pos_y ) { | |
|         last_significant_coeff_flag = 1 | |
|         numCoeff = i + 1 | |
|       } | |
|       if( !last_significant_coeff_flag ) | |
|         significant_coeff_flag[ i ] | ae(v) |
|       i++ | |
|     } | |
|     coeff_abs_level_minus1[ numCoeff − 1 ] | ae(v) |
|     coeff_sign_flag[ numCoeff − 1 ] | ae(v) |
|     coeffLevel[ numCoeff − 1 ] = | |
|       ( coeff_abs_level_minus1[ numCoeff − 1 ] + 1 ) * | |
|       ( 1 − 2 * coeff_sign_flag[ numCoeff − 1 ] ) | |
|     for( i = numCoeff − 2; i >= startIdx; i− − ) | |
|       if( significant_coeff_flag[ i ] ) { | |
|         coeff_abs_level_minus1[ i ] | ae(v) |
|         coeff_sign_flag[ i ] | ae(v) |
|         coeffLevel[ i ] = ( coeff_abs_level_minus1[ i ] + 1 ) * | |
|           ( 1 − 2 * coeff_sign_flag[ i ] ) | |
|       } | |
|   } | |
| } | |

Figure 7:
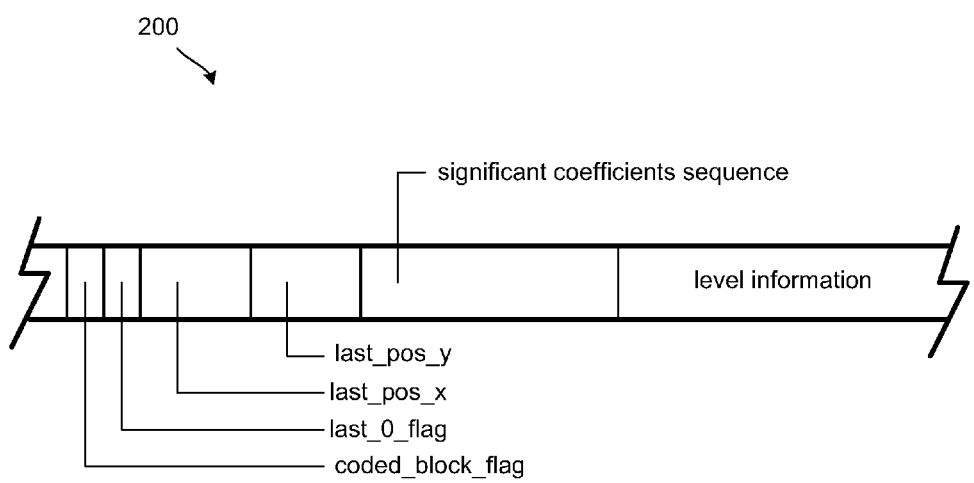
FIG. 7 diagrammatically shows a portion of a bitstream.

Reference is now made to FIG. 7, which diagrammatically illustrates the structure of the bitstream 200 created in accordance with an aspect of the present application. The portion of the bitstream 200 illustrated in FIG. 7, shows data relating to a residual block. The portion of the bitstream 200 as shown is the bitstream before entropy encoding or after entropy decoding. The entropy encoding may include CABAC, CAVLC, or other context-based entropy coding schemes.

The leading flag is the coded_block_flag. This flag is followed by the last_0_flag for signaling last significant coefficient coordinates of [0,0]. Then, presuming that the last_0_flag is not set, the bitstream 200 includes the last_pos_x and last_pos_y values. Following those is the sig[i,j] sequence, i.e. the significant coefficients sequence. Finally, the portion of the bitstream 200 includes level information. It will be understood that in cases where the last_0_flag is set, then the last_pos_x, last_pos_y, and significant coefficients sequence are omitted.

In one embodiment, the last_pos_x and last_pos_y values are binarized using fixed-length binarization. The length of these binary values is dependent upon the size of the transform matrix, i.e. the size of the block of quantized transform domain coefficients.

Figure 8:
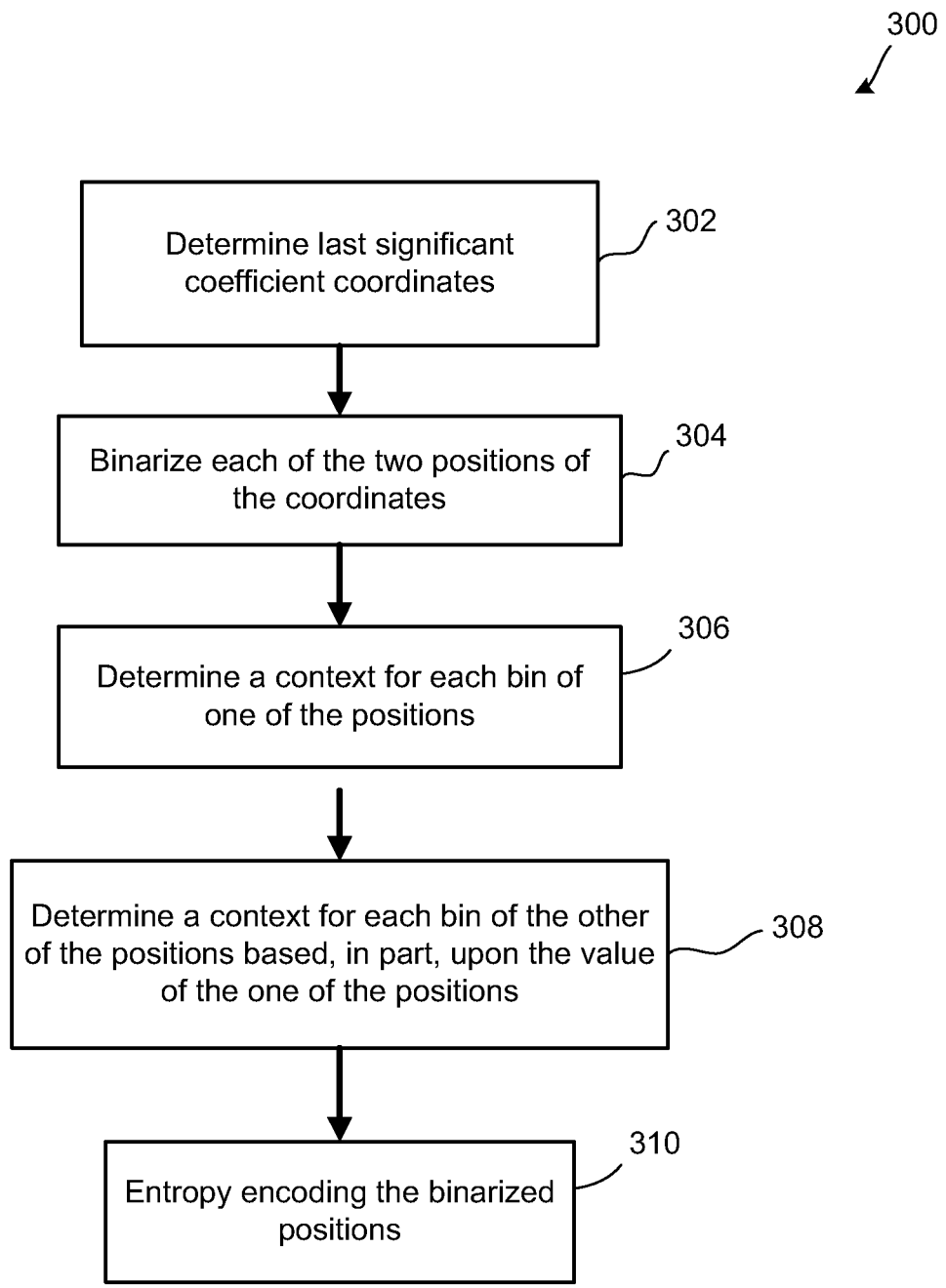
FIG. 8 shows, in flowchart form, an example method of entropy encoding last significant coefficient information.

Reference is now made to FIG. 8, which shows an example method 300 for encoding last significant coefficient data when encoding a residual block. The example method 300 includes an operation 302 of determining the last significant coefficient coordinates. These coordinates may be x- and y-coordinates ranging from 0 to N−1, for an N×N transform block size. The coordinates may be referred to as an x-position and a y-position.

In operation 304, the two positions are binarized. As noted above, the positions may be binarized using a fixed-length binarization. The length of the binarized position may be $\log_2(N)$. Other binarization schemes may be used in other embodiments.

The entropy encoding of the binarized positions involves determining a context for each bin of the binarized positions. Accordingly, in operation 306, the context for each bin of one of the positions is determined. For the purpose of an example embodiment, the x-position may be considered the first position to be encoded. The context for each bin of the binarized x-position may be based upon a number of factors. For example, in one embodiment the context of each bin of the x-position may be based upon the size of the transform matrix. Previous bins of the x-position (if any) may also impact the context for subsequent bins of that x-position.

In operation 308, the context for each bin of the other one of the positions (in this example, the y-position) is then determined. In determining the context for bins of the y-position, the context is partly dependent upon the value of the x-position. The context for bins of the y-position may also be partly dependent upon the size of the transform matrix and previous bins (if any) in the y-position.

In operation 310, the binarized positions are then entropy encoded in accordance with their associated contexts as determined in steps 306 and 308. The entropy encoding may include CABAC, CAVLC, or any other suitable context-based entropy encoding scheme.

Figure 9:
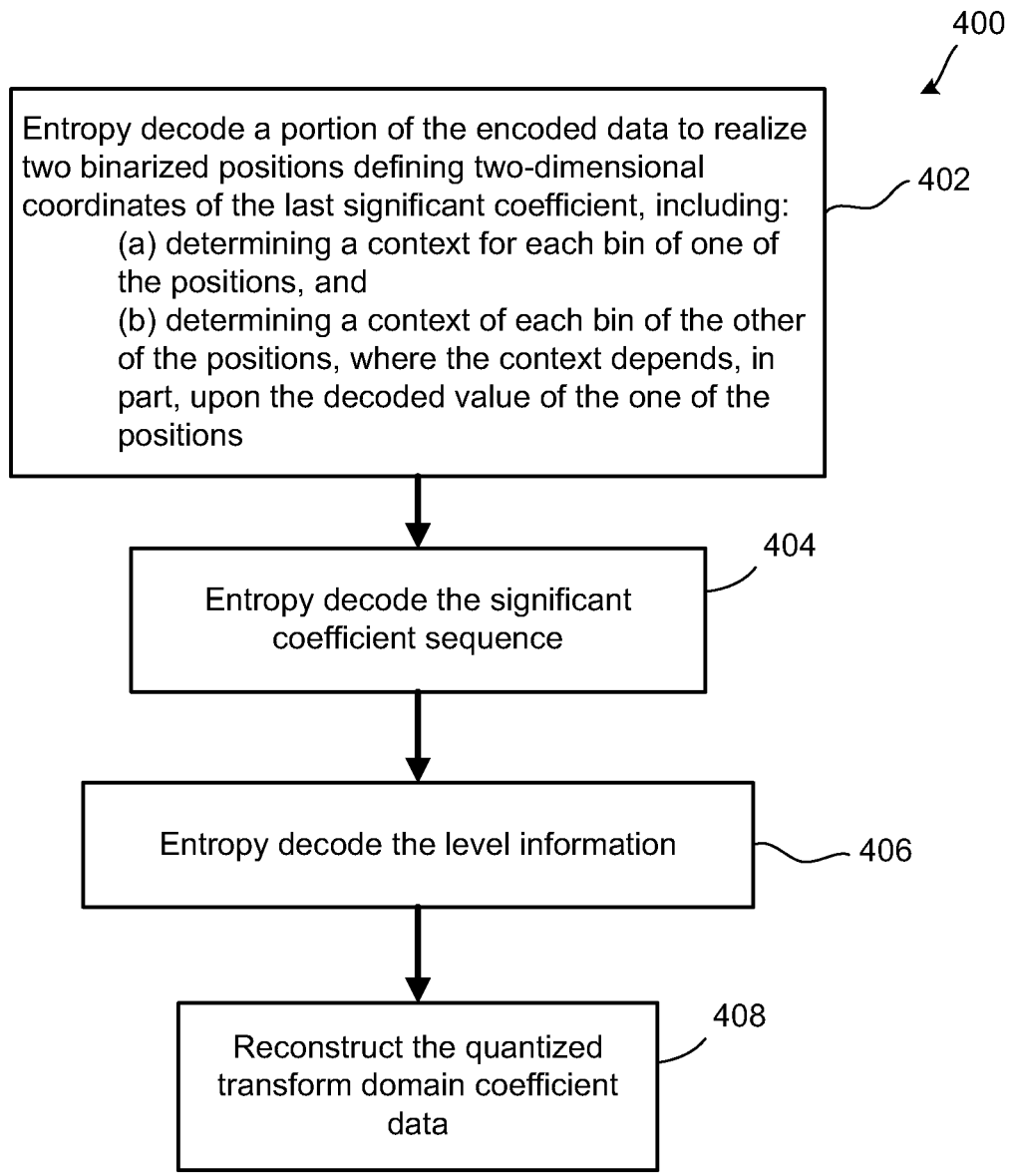
FIG. 9 shows, in flowchart form, an example method of entropy decoding a bitstream of encoded data to reconstruct quantized transform domain coefficient data.

Reference will now be made to FIG. 9, which shows a flowchart depicting a method 400 for decoding a bitstream of encoded data to reconstruct quantized transform domain coefficient data. The example method 400 illustrated in FIG. 9 involves processing a bitstream of encoded data using a syntax similar to that described herein. In operation 402, a portion of the bitstream is entropy decoded to recover the two binarized positions that define the two-dimensional coordinates for the last significant coefficient. This operation includes determining a context for each bin of a first one of the positions (for example, the x-position in one embodiment). That context may depend upon, for example, the size of the transform matrix and previously decoded bins of the x-position, if any. Based upon the context for each bin, and thus the associated estimated probability, entropy decoding of the bitstream determines that bin, which results in reconstructing the binarized x-position.

Operation 402 further includes determining the context of each bin of the other position (the y-position in this example). The context of each bin of the y-position may depend upon the size of the transform matrix and previous bins of the y-position, if any, but it further depends upon the value of the x-position. Entropy decoding of the bitstream in accordance with the determined context for each bin and its consequent estimated probability, results in reconstruction of the binarized y-position.

In operation 404, the x-position and y-position are used to entropy decode the significant coefficient sequence from the bitstream. In operation 406, the level information is recovered from the bitstream using entropy decoding. The significant coefficient sequence and level information together are used to reconstruct the quantized transform domain coefficient data in operation 408.

In one example implementation, the context for bins of the x-position (if it is the first to be encoded of the two-dimensional coordinates) is given by:

$$\text{ctxIdxInc} = \text{binCtxOffset} + \text{binCtxInc}$$

In this expression, ctxIdxInc is the context index for a given bin of last_pos_x. The variable binCtxOffset is the context offset based upon the transform size. In one embodiment the offset is determined in accordance with the following table:

| log2TrafoSize | binCtxOffset |
|---|---|
| 2 | 0 |
| 3 | 3 |
| 4 | 10 |
| 5 | 17 |

In this example, log 2TrafoSize is the binary logarithm of the transform matrix size, i.e. $\log_2(N)$.

The other variable in the expression for context index above is binCtxInc, which represents the context index increment applied based upon the value of prior bins in last_pos_x, if any. The binCtxInc variable may be determined, for example, in accordance with the following table:

| binIdx | $b_0$ | $b_1$ | binCtxInc |
|---|---|---|---|
| 0 | na | na | 0 |
| 1 | 0 | na | 1 |
| 1 | 1 | na | 2 |
| >=2 | 0 | 0 | 3 |
| >=2 | 0 | 1 | 4 |
| >=2 | 1 | 0 | 5 |
| >=2 | 1 | 1 | 6 |

In this example, binIdx is the index of the bin in last_pos_x and $b_0$ and $b_1$ are bins in the last_pos_x binary sequence at index 0 and 1, respectively.

In one example embodiments, the context for bins of last_pos_y may be determined in accordance with the expression:

ctxIdxInc=binCtxOffset0+3*binCtxOffset1+binCtxInc

In this case, the context for a bin of last_pos_y depends upon the size of the transform matrix, prior bins of last_pos_y, if any, and upon the last_pos_x value. Specifically, the transform matrix impacts context through the variable binCtxOffset0, which may be determined in accordance with the following table in some embodiments:

| log2TrafoSize | binCtxOffset0 |
|---|---|
| 2 | 0 |
| 3 | 9 |
| 4 | 21 |
| 5 | 35 |

The decoded bins of last_pos_y may impact context through the variable binCtxInc, which may be determined in accordance with the following table in some embodiments:

| binIdx | $b_0$ | binCtxInc |
|---|---|---|
| 0 | na | 0 |
| >=1 | 0 | 1 |
|  | 1 | 2 |

In this example, it will be noted that it is only the first bin at index 0 that impacts context for any further bins of last_pos_y.

Finally, the value of last_pos_x may impact the context for a bin of last_pos_y through the variable binCtxOffset1, which may be determined by:

If last_pos_x==0 binCtxOffset1=0

Otherwise binCtxOffset1=Floor(Log 2(last_pos_x))+1

It will be appreciated that the foregoing example is but one example implementation in which the context for bins of last_pos_y is dependent upon the value of last_pos_x. It will be understood that various other implementations may be realized with specific tables and context offsets empirically designed to suit a particular application.

The meaning of the context index may be dependent upon the value of the quantization parameter (QP). That is, different contexts may be used to code the same syntax with different QPs. Yet, these contexts may share the same context index. In one example embodiment, last_pos_x may be coded by Huffman codes. The corresponding Huffman trees may be dependent upon the value of QP. The contexts for coding bins of last_pos_x may be dependent upon the Huffman tree and thereby are different at different QPs. For example, if one context is used for each QP, these contexts may share the same index 0 but have different meanings.

Figure 11:
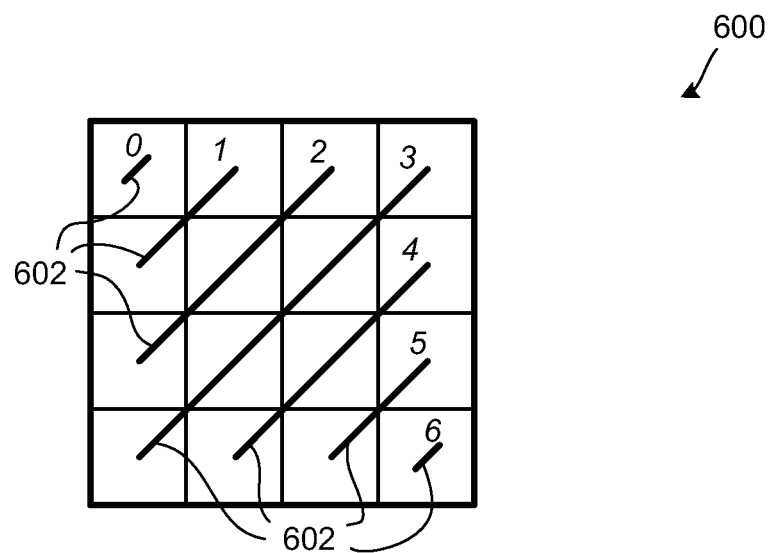
FIG. 11 shows an anti-diagonal grouping of coefficients in a 4×4 block.

In an alternative implementation, instead of encoding the two-dimensional Cartesian coordinates x and y, the last significant coefficient position is represented by the anti-diagonal line that the coefficient is on and the relative position of the coefficient on that line. Reference is made to FIG. 11, which diagrammatically illustrates a 4×4 block of coefficients 600. The anti-diagonal lines 602 are shown on the block 600. It will be noted that there are seven anti-diagonal lines, indexed as 0 to 6. Lines 0 and 6 have only a single position, which corresponds to x, y coordinates [0,0] and [3,3], respectively. The other anti-diagonal lines 602 have between 2 and 4 positions each. The positions may be indexed in accordance with the conventions of the scanning order. That is, the indexing of the positions on the anti-diagonal lines may alternate from line-to-line in terms of their directions. Accordingly, the representation of each coordinate in a 4×4 block may be expressed as an anti-diagonal-based two-dimensional coordinate, [a, b], as follows:

[0,0] [1,0] [2,2] [3,0]
[1,1] [2,1] [3,1] [4,2]
[2,0] [3,2] [4,1] [5,0]
[3,3] [4,0] [5,1] [6,0]

It will be noted that the last positions, [0,0] and [6,0], may be encoded by their anti-diagonal line number alone as there is no need to specify the second coordinate for position on the line.

The [a, b] values may be encoded in a manner similar to that described above for two-dimensional coordinates x and y. The total number of coded bins for the anti-diagonal line index, a, is $\log_2(2N-1)$. The number of coded bins for the position of the coefficient on the line, b, is dependent upon the value a, and is $1+\log_2(a)$ for a<N and is $1+\log_2(2(N-1)-a)$ if a≥N. The context for encoding/decoding each bin is based upon the value of the prior encoded/decoded bins.

In one other alternative implementation, rather than encoding a two-dimensional coordinate for the last significant coefficient position, the encoder encodes the 1-dimensional coordinate for the last significant position having regard to the coefficient scanning order. The coefficient scanning order may be in the zig-zag order used in H.264, or in any adaptive or non-adaptive scanning order used in other transform domain image or video encoding schemes. In this implementation, instead of last_pos_x and last_pos_y, the encoder encodes only last_pos, which ranges from 0 to (N*N−1), where N is the size of the block of transform domain coefficients. The range for last_pos need not include zero if the last_0_flag is used in the syntax. In some instances, last_pos may be automatically decremented, such that the decoder knows it must add 1 to the last_pos value to realize the actual 1-dimensional coordinate for the last significant coefficient position.

The last_pos value may be encoded in a manner similar to that described above for one of the two-dimensional coordinates x. The total number of coded bins for the 1-dimensional coordinate, last_pos, is $2 \log_2(N)$. The context for encoding/decoding each bin is based upon the value of the prior encoded/decoded bins.

It should be noted that in the example implementations, the worst-case number of coded bins for the two-dimensional (or one-dimensional) last significant coefficient position is in the order of $\log_2(N)$, which is far less than N*N, the worst-case number of coded bins for the conventional last[i,j] sequences, thereby reducing the complexity in entropy coding engine implementation.

In yet a further aspect of the present application, it may be advantageous to use the last position encoding process described above only with certain blocks. In particular, the process may be more advantageous with block having more than a preset number of coefficients. Block that have few coefficients may be more efficiently encoded using the conventional interleaved sig[i,j] and last[i,j] syntax described earlier. Accordingly, in one embodiment, the encoder determines the number of non-zero (NNZ) coefficients in a block and encodes the sig[i,j] and last[i,j] sequences using conventional syntax if the NNZ is less than a threshold value. The threshold value may be preset at 2, 3 or any other suitable value. If the NNZ is equal to or greater than the threshold value, then the encoder uses the two-dimensional (or one-dimensional) last significant coefficient position encoding process described above.

The syntax may be adapted to include a flag for signaling to the decoder whether the NNZ coefficients for a block are less than a threshold value or not. This also signals which significant map encoding process was used by the encoder. In some instance, the last_0_flag may be eliminated since the signaling of a DC only block is relatively efficient in the conventional significance map encoding process.

Figure 10:
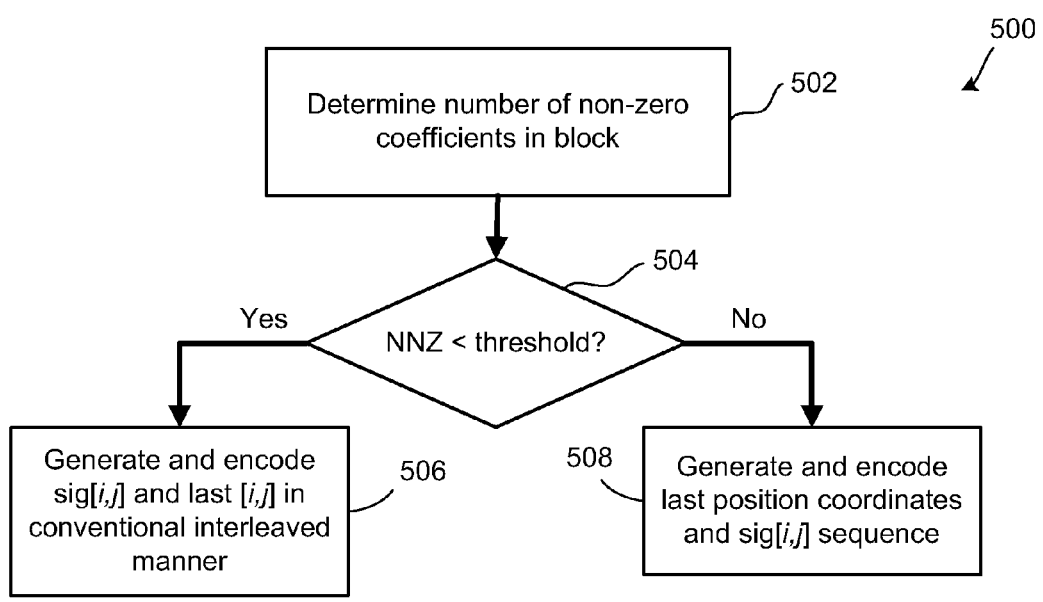
FIG. 10 shows, in flowchart form, an example method of encoding a significance map.

Reference is now made to FIG. 10, which shows, in simplified flow diagram form, a method 500 for encoding a significance map. The method 500 is performed for each block of quantized transform domain coefficients. It includes determining the NNZ coefficients in the block in operation 502. In operation 504, the NNZ coefficients is compared to a preset threshold. If the NNZ coefficients is below the threshold, then the encoder uses conventional interleaved significance map encoding as indicated in operation 506. If the NNZ coefficients is equal to or greater than the threshold value, then in operation 508 the encoder encodes the last position coordinates as described above.

It will be appreciated that the foregoing example methods are illustrations of a specific example application for encoding and decoding significance maps, such as those prescribed in H.264. The present application is not limited to that specific example application.

Figure 4:
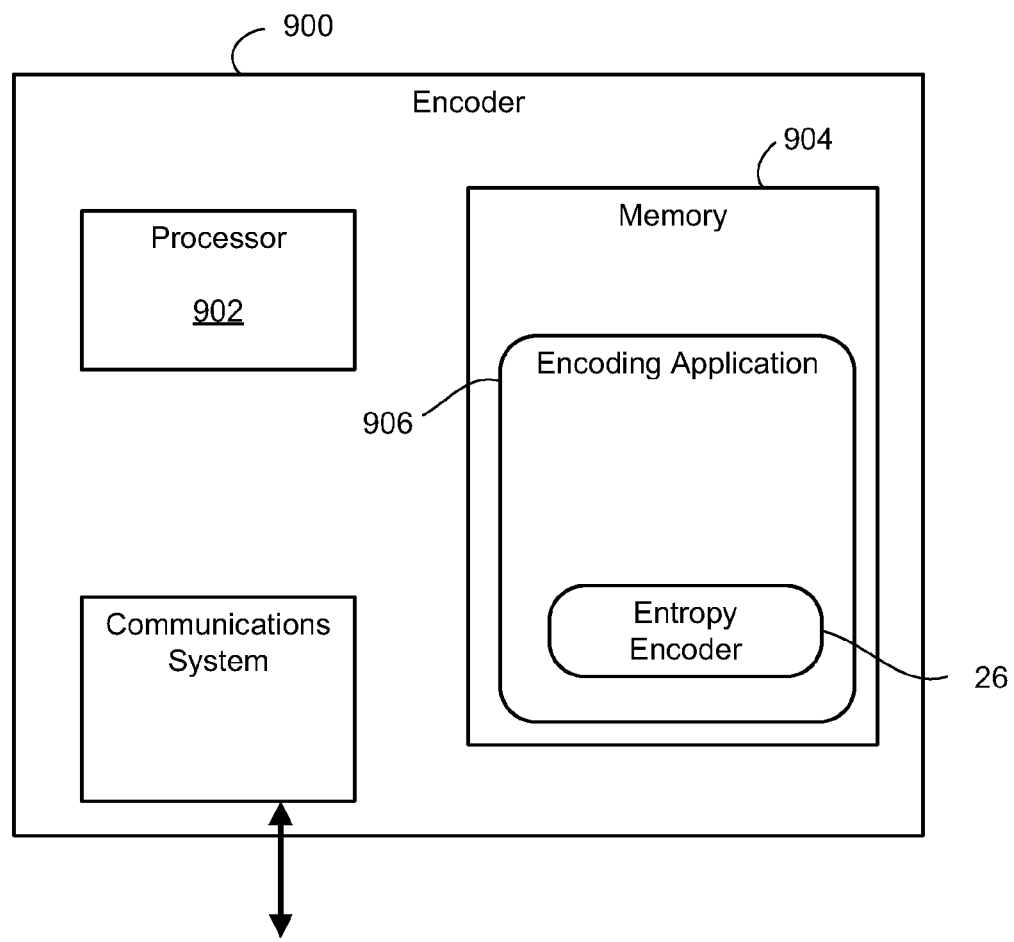
FIG. 4 shows a simplified block diagram of an example embodiment of an encoder.

Reference now made to FIG. 4, which shows a simplified block diagram of an example embodiment of an encoder 900. The encoder 900 includes a processor 902, memory 904, and an encoding application 906. The encoding application 906 may include a computer program or application stored in memory 904 and containing instructions for configuring the processor 902 to perform steps or operations such as those described herein. For example, the encoding application 906 may encode and output bitstreams encoded in accordance with the last significant coefficient position encoding process described herein. The encoding application 906 may include an entropy encoder 26 configured to entropy encode input sequences and output a bitstream using one or more of the processes described herein. It will be understood that the encoding application 906 may be stored in on a computer readable medium, such as a compact disc, flash memory device, random access memory, hard drive, etc.

In some embodiments, the processor 902 in the encoder 900 may be a single processing unit configured to implement the instructions of the encoding application 906. It will further be appreciated that in some instances, some or all operations of the encoding application 906 and one or more processing units may be implemented by way of application-specific integrated circuit (ASIC), etc.

Figure 5:
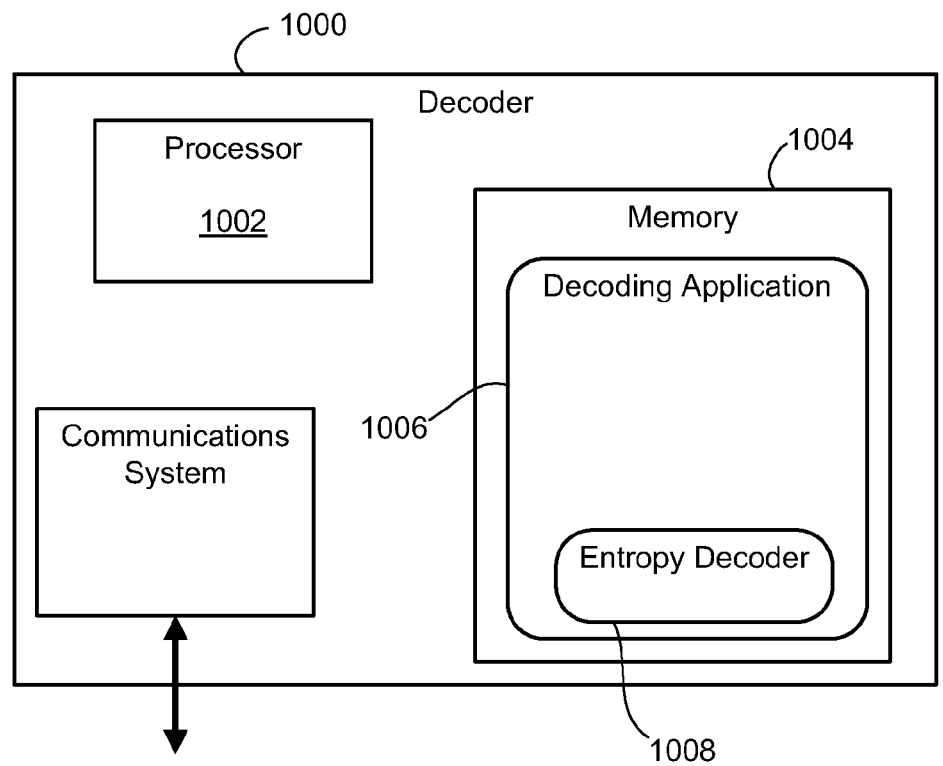
FIG. 5 shows a simplified block diagram of an example embodiment of a decoder.

Reference is now also made to FIG. 5, which shows a simplified block diagram of an example embodiment of a decoder 1000. The decoder 1000 includes a processor 1002, a memory 1004, and a decoding application 1006. The decoding application 1006 may include a computer program or application stored in memory 1004 and containing instructions for configuring the processor 1002 to perform steps or operations such as those described herein. The decoding application 1006 may include an entropy decoder 1008 configured to receive a bitstream encoded in accordance with the last significant coefficient position encoding process described herein, and to reconstruct quantized transform domain coefficient data using the last significant coefficient position context modeling process for decoding the bitstream, as described herein. It will be understood that the decoding application 1006 may be stored in on a computer readable medium, such as a compact disc, flash memory device, random access memory, hard drive, etc.

In some embodiments, the processor 1002 in the decoder 1000 may be a single processing unit configured to implement the instructions of the decoding application 1006. In some other embodiments, the processor 1002 may include more than one processing unit capable of executing instructions in parallel. The multiple processing units may be logically or physically separate processing units. It will further be appreciated that in some instances, some or all operations of the decoding application 1006 and one or more processing units may be implemented by way of application-specific integrated circuit (ASIC), etc.

It will be appreciated that the decoder and/or encoder according to the present application may be implemented in a number of computing devices, including, without limitation, servers, suitably programmed general purpose computers, set-top television boxes, television broadcast equipment, and mobile devices. The decoder or encoder may be implemented by way of software containing instructions for configuring a processor to carry out the functions described herein. The software instructions may be stored on any suitable computer-readable memory, including CDs, RAM, ROM, Flash memory, etc.

It will be understood that the encoder and decoder described herein and the module, routine, process, thread, or other software component implementing the described method/process for configuring the encoder may be realized using standard computer programming techniques and languages. The present application is not limited to particular processors, computer languages, computer programming conventions, data structures, other such implementation details. Those skilled in the art will recognize that the described processes may be implemented as a part of computer-executable code stored in volatile or non-volatile memory, as part of an application-specific integrated chip (ASIC), etc.

Certain adaptations and modifications of the described embodiments can be made. Therefore, the above discussed embodiments are considered to be illustrative and not restrictive.

What is claimed is:

1. A method for encoding quantized transform domain coefficient data in an encoder having a processor, the method comprising:
   determining, with the processor, a first coordinate in a two-dimensional coordinate system and a second coordinate in a two-dimensional coordinate system that together specify a last-significant-coefficient position within a block of the quantized transform domain coefficient data; and
   entropy encoding, with the processor, the first coordinate and the second coordinate by determining a context for encoding of one of the coordinates based upon the value of the other of the coordinates.

2. The method claimed in claim 1, wherein entropy encoding includes binarizing the first coordinate and the second coordinate and entropy encoding each bin of the binarized first coordinate and each bin of the binarized second coordinate.

3. The method claimed in claim 1, wherein the first coordinate comprises an index to an anti-diagonal line in the block passing through the last-significant-coefficient position, and the second coordinate comprises a position of the last-significant-coefficient on the anti-diagonal line.

4. The method claimed in claim 1, wherein entropy encoding includes encoding using Huffman codes.

5. The method claimed in claim 4, wherein encoding includes selecting a Huffman tree containing the Huffman codes, and wherein the selection of the Huffman tree is based at least in part upon a quantization parameter value.

6. The method claimed in claim 1, further comprising first determining that the first coordinate is zero and second coordinate is non-zero and, as a result, decrementing the value of the second coordinate by one before encoding the second coordinate.

7. An encoder for encoding quantized transform domain coefficient data, the encoder comprising:
    a processor;
    a memory; and
    an encoding application stored in memory and containing instructions that, when executed, cause the processor to
        determine a first coordinate in a two-dimensional coordinate system and a second coordinate in a two-dimensional coordinate system that together specify a last-significant-coefficient position within a block of the quantized transform domain coefficient data, and
        entropy encode the first coordinate and the second coordinate by determining a context for encoding of one of the coordinates based upon the value of the other of the coordinates.

8. The encoder claimed in claim 7, wherein the instructions, when executed, cause the processor to entropy encode by binarizing the first coordinate and the second coordinate and entropy encoding each bin of the binarized first coordinate and each bin of the binarized second coordinate.

9. The encoder claimed in claim 7, wherein the first coordinate comprises an index to an anti-diagonal line in the block passing through the last-significant-coefficient position, and the second coordinate comprises a position of the last-significant-coefficient on the anti-diagonal line.

10. The encoder claimed in claim 7, wherein the instructions, when executed, cause the processor to entropy encode using Huffman codes.

11. The encoder claimed in claim 10, wherein the instructions, when executed, cause the processor to select a Huffman tree containing the Huffman codes, and wherein the selection of the Huffman tree is based at least in part upon a quantization parameter value.

12. The encoder claimed in claim 7, wherein the instructions, when executed, cause the processor to first determine that the first coordinate is zero and second coordinate is non-zero and, as a result, decrement the value of the second coordinate by one before encoding the second coordinate.

13. A method for decoding a bitstream of encoded data to reconstruct quantized transform domain coefficient data in a decoder having a processor, the method comprising:
    entropy decoding, with a processor, a portion of the encoded data to reconstruct a first coordinate and a second coordinate that together specify a last-significant-coefficient position within a block of the quantized transform domain coefficient data, including
        determining a context for entropy decoding the first coordinate, and
        determining a context for entropy decoding the second coordinate based upon the reconstructed value of the first coordinate.

14. The method claimed in claim 13, wherein entropy decoding includes entropy decoding the bins of a binarized first coordinate and the bins of a binarized second coordinate and reconstructing the first coordinate and the second coordinate from their respective decoded bins.

15. The method claimed in claim 13, wherein the first coordinate comprises an index to an anti-diagonal line in the block passing through the last-significant-coefficient position, and the second coordinate comprises a position of the last-significant-coefficient on the anti-diagonal line.

16. The method claimed in claim 13, wherein entropy decoding includes decoding using Huffman codes.

17. The method claimed in claim 16, wherein decoding includes selecting a Huffman tree containing the Huffman codes, and wherein the selection of the Huffman tree is based at least in part upon a quantization parameter value.

18. The method claimed in claim 13, further comprising determining that the first coordinate is zero and, as a result, incrementing the value of the reconstructed second coordinate by one after decoding the second coordinate.

19. A decoder for decoding a bitstream of encoded data to reconstruct quantized transform domain coefficient data, the decoder comprising:
    a processor;
    a memory; and
    a decoding application stored in memory and containing instructions that, when executed, cause the processor to
        entropy decode a portion of the encoded data to reconstruct a first coordinate and a second coordinate that together specify a last-significant-coefficient position within a block of the quantized transform domain coefficient data, including
            determining a context for entropy decoding the first coordinate, and
            determining a context for entropy decoding the second coordinate based upon the reconstructed value of the first coordinate.

20. The decoder claimed in claim 19, wherein the instructions, when executed, cause the processor to entropy decode by entropy decoding the bins of a binarized first coordinate and the bins of a binarized second coordinate and reconstructing the first coordinate and the second coordinate from their respective decoded bins.

21. The decoder claimed in claim 19, wherein the first coordinate comprises an index to an anti-diagonal line in the block passing through the last-significant-coefficient position, and the second coordinate comprises a position of the last-significant-coefficient on the anti-diagonal line.

22. The decoder claimed in claim 19, wherein entropy decoding includes decoding using Huffman codes.

23. The decoder claimed in claim 22, wherein the instructions, when executed, cause the processor to entropy decode by selecting a Huffman tree containing the Huffman codes, and wherein the selection of the Huffman tree is based at least in part upon a quantization parameter value.

24. The decoder claimed in claim 18, wherein the instructions, when executed, cause the processor to determine that the first coordinate is zero and, as a result, increment the value of the reconstructed second coordinate by one after decoding the second coordinate.

* * * * *